(12) United States Patent
Kubota et al.

(10) Patent No.: US 8,968,498 B2
(45) Date of Patent: Mar. 3, 2015

(54) CRYSTAL-OSCILLATOR FABRICATING APPARATUS AND METHOD

(75) Inventors: Hajime Kubota, Kawasaki (JP); Masayuki Itoh, Kawasaki (JP); Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 763 days.

(21) Appl. No.: 12/890,785

(22) Filed: Sep. 27, 2010

(65) Prior Publication Data

US 2011/0073240 A1 Mar. 31, 2011

(30) Foreign Application Priority Data

Sep. 29, 2009 (JP) ................. 2009-225083

(51) Int. Cl.
*B29C 65/00* (2006.01)
*H03H 9/05* (2006.01)
*H03H 9/10* (2006.01)

(52) U.S. Cl.
CPC ........... *H03H 9/0509* (2013.01); *H03H 9/0547* (2013.01); *H03H 9/1021* (2013.01)
USPC ............ 156/64; 156/98; 156/272.8; 156/709; 156/711; 156/712

(58) Field of Classification Search
USPC .................. 156/64, 98, 272.8, 709, 711, 712; 29/402.01
See application file for complete search history.

(56) References Cited

U.S. PATENT DOCUMENTS

| 4,464,599 | A | * | 8/1984 | Briese ............................ 310/348 |
| 5,406,682 | A | * | 4/1995 | Zimnicki et al. ............. 29/25.35 |
| 6,531,807 | B2 | * | 3/2003 | Tanaka et al. ................. 310/344 |
| 2001/0005544 | A1 | * | 6/2001 | Miyaji ........................... 428/195 |
| 2007/0296429 | A1 | * | 12/2007 | Nagamatsu ................... 324/754 |
| 2010/0026761 | A1 | * | 2/2010 | Andrews ......................... 347/50 |

FOREIGN PATENT DOCUMENTS

| JP | 5-136569 A | 6/1993 |
| JP | 8-167823 A | 6/1996 |
| JP | 2001-76569 A | 3/2001 |
| JP | 2001-292045 A | 10/2001 |
| JP | 2003-133603 | 5/2003 |

OTHER PUBLICATIONS

Japanese Office Action mailed May 7, 2013 for corresponding Japanese Application No. 2009-225083, with Partial English-language Translation.

* cited by examiner

*Primary Examiner* — George Koch
(74) *Attorney, Agent, or Firm* — Fujitsu Patent Center

(57) ABSTRACT

A method of fabricating a crystal oscillator includes applying an adhesive to an electrode pad; determining whether the applied adhesive is in an area outside of the electrode pad; removing at least part of the adhesive in the area outside of the electrode pad using a laser beam when a portion of the applied adhesive is determined to be in the area outside of the electrode pad; and disposing an electrode of a crystal resonator on the adhesive applied to the electrode pad.

6 Claims, 27 Drawing Sheets

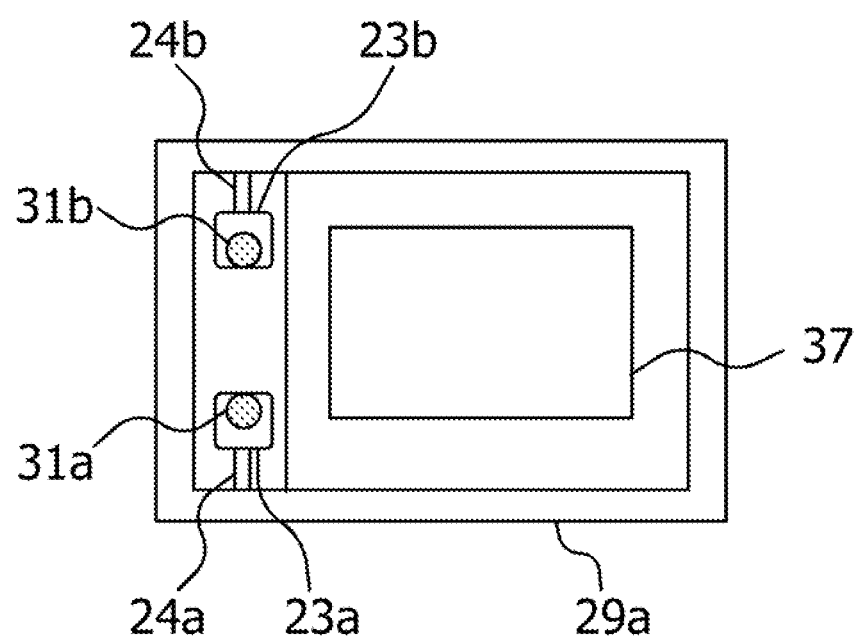

310

320

330

340

CRYSTAL-OSCILLATOR FABRICATING APPARATUS AND METHOD

CROSS-REFERENCE TO RELATED APPLICATIONS

This application is based upon and claims the benefit of priority of the prior Japanese Patent Application No. 2009-225083, filed on Sep. 29, 2009, the entire contents of which are incorporated herein by reference.

FIELD

The embodiments discussed herein are related to a method of fabricating a crystal oscillator and a crystal-oscillator fabricating apparatus.

BACKGROUND

A crystal resonator includes a crystal element (also referred to as a "crystal blank") interposed between an electrode pair. Because a crystal element may be a piezoelectric body, it changes shape when a voltage is applied. As a result, the crystal oscillator causes the crystal resonator to vibrate at its natural frequency. The crystal oscillator connects the electrodes of the crystal resonator using a conductive adhesive on electrode pads in a package. The electrode pads support the crystal resonator inside the package of the crystal oscillator. In other words, the conductive adhesive provides both electrical connection and mechanical support, without interfering with the natural frequency of the crystal resonator.

As a technique using a conductive adhesive, a technique in which a laser beam is used in a method of fabricating an infrared sensor has been proposed. According to this method of fabricating an infrared sensor, a pyroelectric base material having terminals on the front and back sides is disposed on a conductive plate, and the conductive plate is irradiated with a laser beam to scatter conductive material so that it attaches to the side surfaces of the pyroelectric base material. In this way, the infrared sensor is fabricated by attaching the conductive material to the side surfaces of the pyroelectric base material and causing the terminals on the front and back to short-circuit.

In the fabrication process of a crystal oscillator, a conductive adhesive is applied on an electrode pad inside a package of a crystal oscillator, and a crystal element is disposed on the conductive adhesive. The precision of the vibration of a crystal resonator is largely influenced by the amount and surface area of the conductive adhesive. Since the conductive adhesive is prepared through a mixing process carried out mechanically or manually, the viscosity of the conductive adhesive varies. For example, when a conductive adhesive having a viscosity lower than a predetermined value is applied on an electrode pad, the conductive adhesive runs off the electrode pad, causing the application area of the conductive adhesive to increase. The application area of the conductive adhesive also increases when the amount of conductive adhesive applied increases. In this way, an increase in the amount and/or the application area of the conductive adhesive influences the natural frequency of the crystal resonator. Moreover, the conductive adhesive that runs off the electrode pad causes short-circuiting of other electrode pads, and prevents the crystal resonator from receiving a predetermined voltage.

The size of an electrode pad has been reduced in response to the miniaturization of semiconductor chips; therefore, the conductive adhesive easily runs off the electrode pad. The run-off of the conductive adhesive from an electrode pad reduces the yield of products that are fabricated by applying a conductive adhesive on an electrode pad.

SUMMARY

According to an embodiment, a method of fabricating a crystal oscillator includes applying an adhesive to an electrode pad; determining whether the applied adhesive is in an area outside of the electrode pad; removing at least part of the adhesive in the area outside of the electrode pad using a laser beam when a portion of the applied adhesive is determined to be in the area outside of the electrode pad; and disposing an electrode of a crystal resonator on the adhesive applied to the electrode pad.

The object and advantages of the invention will be realized and attained by at least the feature, elements, and combinations particularly pointed out in the claims.

It is to be understood that both the foregoing general description and the following detailed description are explanatory and are not restrictive of the present invention as claimed.

BRIEF DESCRIPTION OF THE DRAWINGS

FIG. 10A illustrates a top view of a package in which a conductive adhesive is applied;

DESCRIPTION OF EXAMPLE EMBODIMENTS

Figure 1:
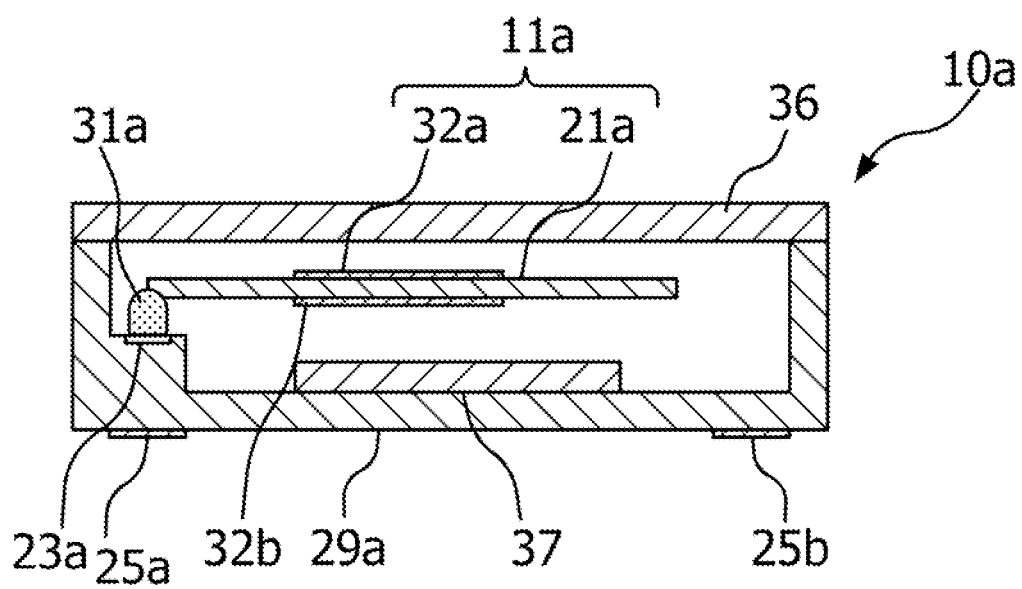
FIG. 1 illustrates a sectional view of a cantilever crystal oscillator.

An embodiment of a method of fabricating a crystal oscillator will be described below with reference to the drawings. In the drawings, the same components are represented by the same reference numbers. Descriptions of components that represented by the same reference numerals representing components described before will not be repeated.

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present.

Figure 2:
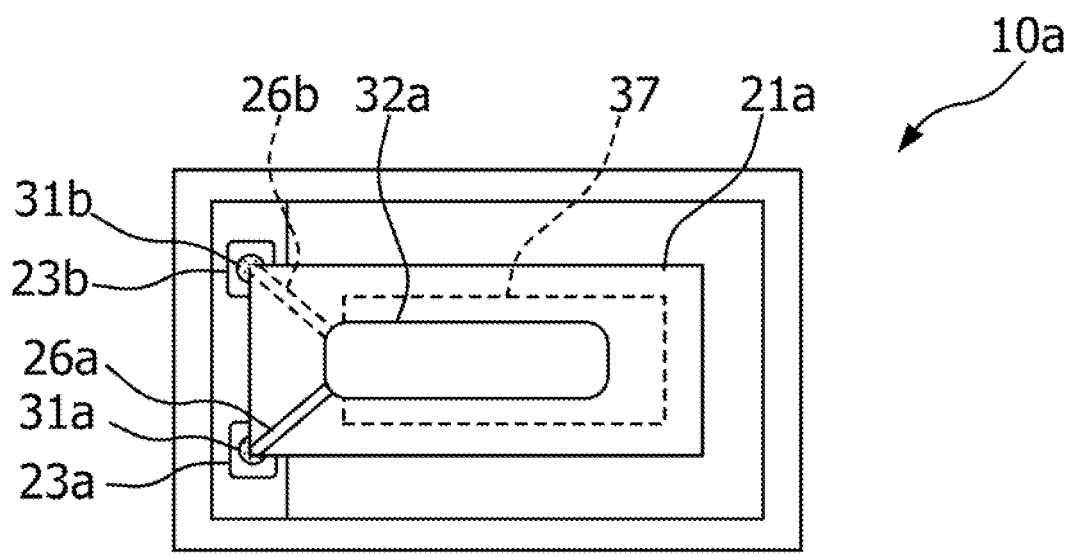
FIG. 2 illustrates a top view of the crystal oscillator illustrated in FIG. 1.

FIG. 1 illustrates a sectional view of an example cantilever crystal oscillator. FIG. 2 illustrates a top view of the cantilever crystal oscillator illustrated in FIG. 1 with its cover removed. A crystal oscillator 10a includes a crystal resonator 11a, an electrode pad 23a, an electrode pad 23b, lower electrode terminals 25a to 25d (lower electrode terminals 25c and 25d are illustrated in FIG. 5), a package 29a, a cover 36, and a peripheral circuit 37.

The crystal resonator 11a has a plate-like crystal element 21a, and two electrodes 32a and 32b sandwiching the crystal element 21a. The electrode 32a is disposed on one side of the crystal element 21a, and the electrode 32b is disposed on the other side of the crystal element 21a. The electrodes 32a and 32b sandwiching the crystal element 21a are electrically connected to the electrode pads 23a and 23b, respectively, via wires 26a and 26b and conductive adhesives 31a and 31b, respectively.

As described above, the crystal resonator 11a is supported by being electrically connected and secured to the electrode pads 23a and 23b, which are disposed on one side of the package 29a. The crystal oscillator 10a having the crystal resonator 11a supported at one end of the package is referred to as "cantilever support type."

The conductive adhesives 31a and 31b are, for example, a mixture of epoxy resin and silver filler that cures at approximately 180° C. After disposing the crystal element 21a on the conductive adhesives 31a and 31b, the conductive adhesives 31a and 31b are heated to firmly secure the crystal element 21a and the electrode pads 23a and 23b.

When the electrodes 32a and 32b applies a voltage to the crystal element 21a, a signal of the natural frequency of the crystal element 21a is output to the electrodes 32a and 32b. The natural frequency of the crystal element 21a is uniquely determined by the thickness and shape of the crystal element 21a. A raw crystal is processed to make the crystal element 21a that outputs a desired frequency.

The electrode pads 23a and 23b are electrically connected to the peripheral circuit 37 via wiring. The peripheral circuit 37 may be electrically connected to the electrode pads 23a and 23b and the lower electrode terminals 25a to 25d. The electrode pads 23a and 23b may be, for example, connected to the peripheral circuit 37 via a wiring pattern (which is described below with reference to FIGS. 9A to 14E). The electrode pads 23a and 23b are, for example, connected to the peripheral circuit 37 via inner-layer wiring (which is described below with reference to FIGS. 16A to 17B).

The package 29a may be a case that accommodates the crystal resonator 11a, the electrode pads 23a and 23b, and the peripheral circuit 37, and is made of, for example, ceramic. The cover 36 may be attached to the package 29a after the components of the crystal oscillator 10a are disposed inside the package 29a in the fabrication process.

The peripheral circuit 37, together with the crystal resonator 11a, may constitute a circuit for the crystal oscillator 10a. The peripheral circuit 37 is a circuit for amplifying the natural frequency signal output from the crystal resonator 11a, converts the amplified signal to a clock pulse, and outputs the clock pulse to an external device.

In FIGS. 1 and 2, the peripheral circuitry 37 is disposed inside the package 29a. Instead, however, the peripheral circuitry 37 may be disposed outside the crystal oscillator 10a.

Figure 3:
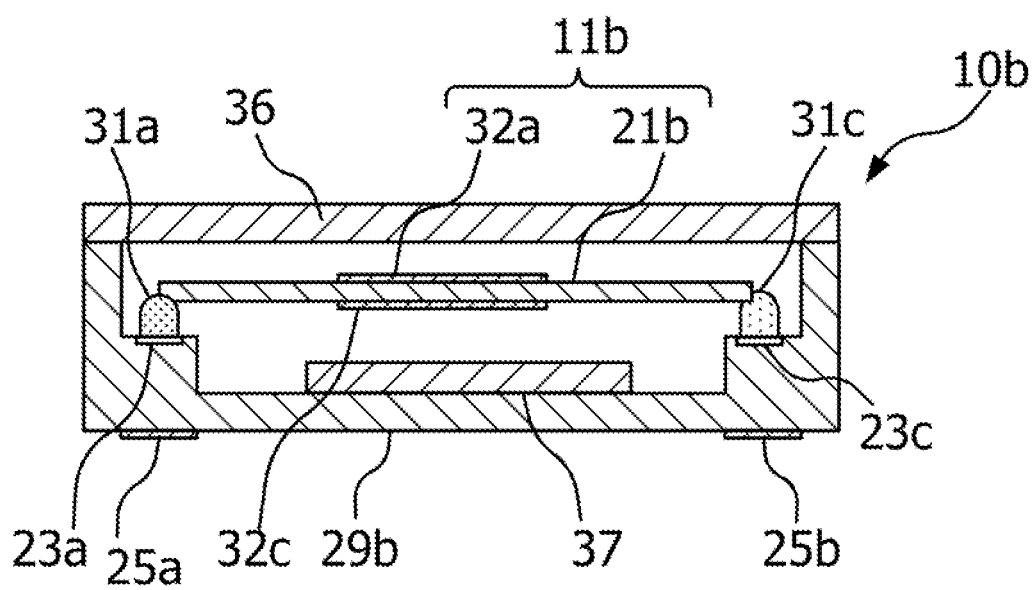
FIG. 3 illustrates a sectional view of a double-cantilever crystal oscillator.
Figure 4:
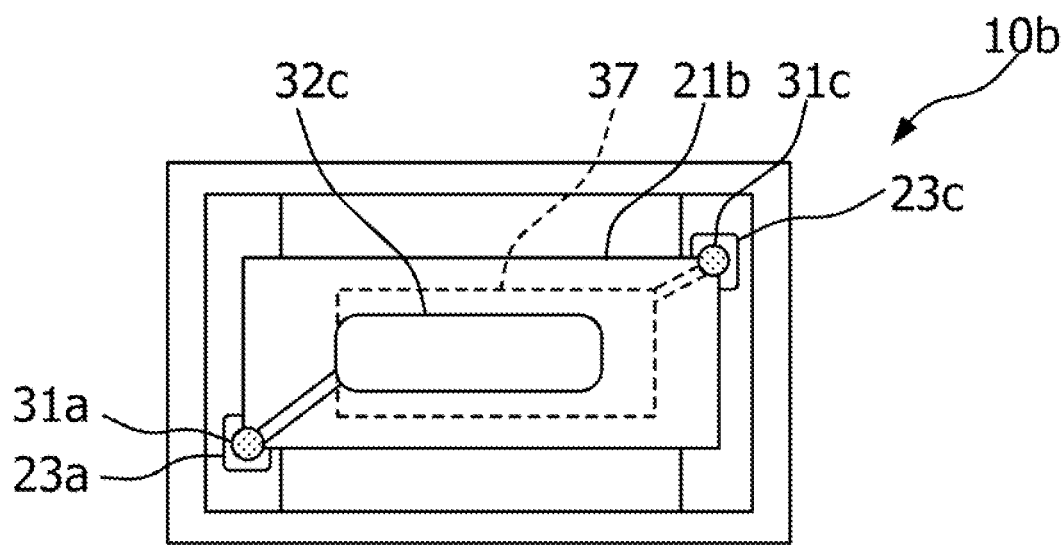
FIG. 4 illustrates a top view of the crystal oscillator illustrated in FIG. 3.

FIG. 3 illustrates an example dual-cantilever crystal oscillator. FIG. 4 illustrates a top view of the dual-cantilever crystal oscillator illustrated in FIG. 3. A crystal oscillator 10b includes a crystal resonator 11b, electrode pads 23a and 23c, lower electrode terminals 25a to 25d (lower electrode terminals 25c and 25d are illustrated in FIG. 5), a package 29b, a cover 36, and a peripheral circuit 37.

In the crystal oscillator 10b, the crystal resonator 11b is held by the conductive adhesives 31a and 31b on the electrode pads 23a and 23c disposed at diagonal corners of the package 29b. A crystal element 21b is sandwiched by the electrode 32a on the upper surface of the crystal element 21b and the electrode 32c on the lower surface of the crystal element 21b. The electrode 32a is connected to the electrode pad 23a via wiring, and the electrode 32c is connected to the electrode pad 23c disposed at the edge opposite to the package 29b via wiring.

The crystal oscillator 10b having the crystal resonator 11b supported by the electrode pads 23a and 23c disposed at both ends of the package 29b is referred to as "double-cantilever support type."

Figure 5A:
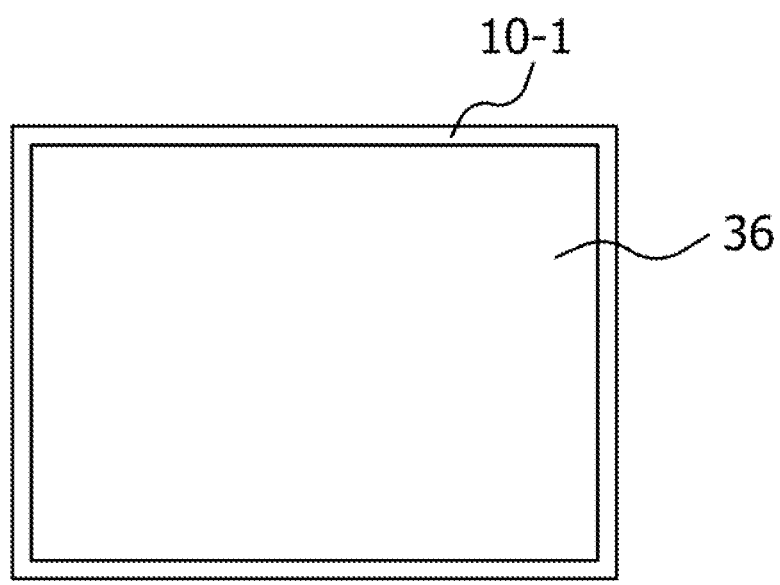
FIG. 5A illustrates an example of a front surface of a crystal oscillator.
Figure 5B:
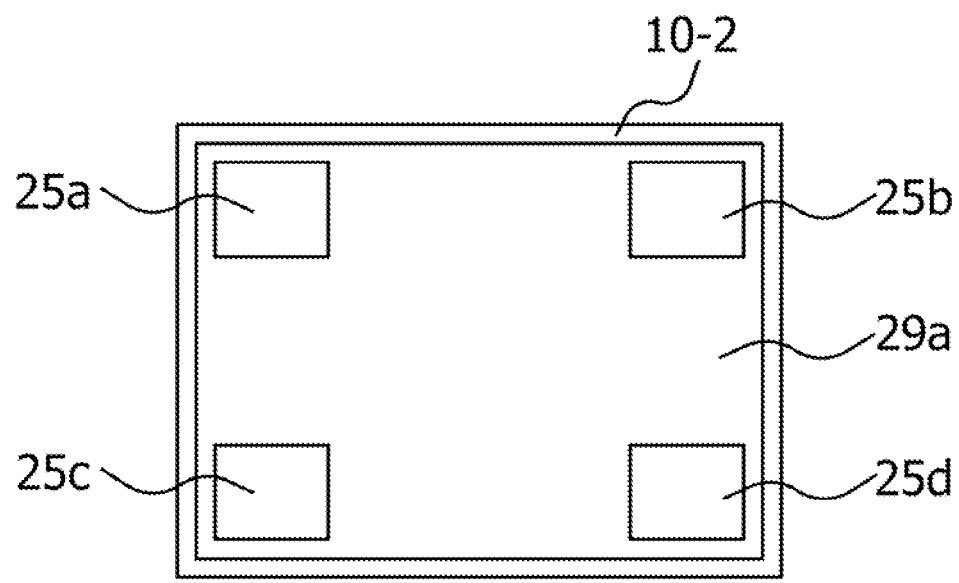
FIG. 5B illustrates an example of a back surface of the crystal oscillator.

FIG. 5A illustrates the front surface of the crystal oscillator, and FIG. 5B illustrates the back surface of the crystal oscillator. A front surface 10-1 of the crystal oscillator is the top surface of the cover 36 plated with, for example, nickel. A back surface 10-2 of the crystal oscillator is the bottom surface of the package 29a and the lower electrode terminals 25a to 25d are disposed thereon. The lower electrode terminals 25a to 25d are electrically connected to the above-described peripheral circuitry 37. The lower electrode terminal 25a may be, for example, a control terminal for starting or stopping voltage application to the crystal resonator. The lower electrode terminal 25b may be, for example, a power-connection terminal. The lower electrode terminal 25c may be, for example, an output terminal. The lower electrode terminal 25d may be, for example, a grounding terminal.

As illustrated in FIGS. 1 to 4, the crystal resonators 11a and 11b are disposed inside the packages 29a and 29b, respectively, with sufficient space around them for freely changing shape due to the piezoelectric effect. The crystal resonators 11a and 11b can freely change shape by being supported by the conductive adhesive. However, if the adhesive force of the conductive adhesive is reduced due to the run-off of the conductive adhesive from the electrode pads, the shape changing of the crystal element becomes unstable, and the output signals from the crystal resonators 11a and 11b become unstable. Thus, by decreasing the diameter of the conductive adhesive to a specified value or smaller, the output frequency of the crystal oscillator can be stabilized.

Figure 6:
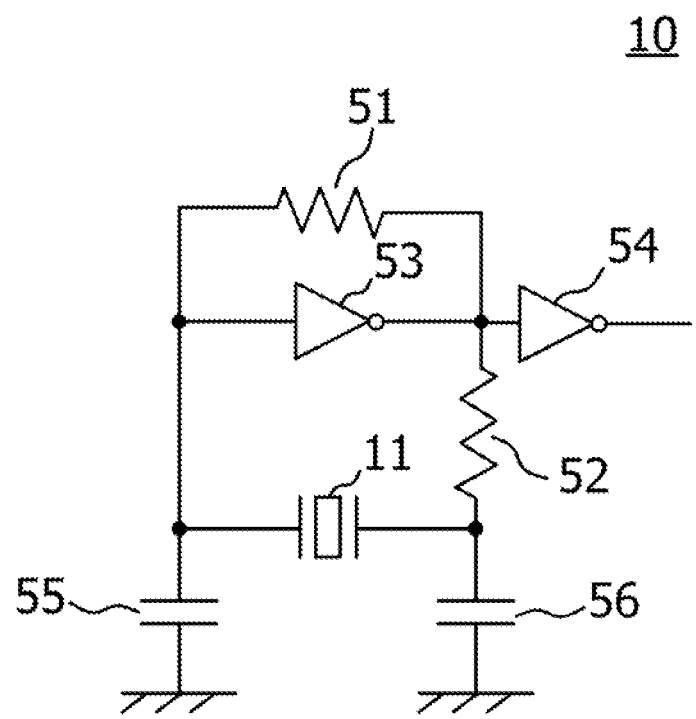
FIG. 6 illustrates an example circuit configuration of the crystal oscillator.

FIG. 6 illustrates an example circuit configuration of the crystal oscillator. A crystal oscillator 10 illustrated in FIG. 6 is substantially identical to the crystal oscillator 10a illustrated in FIGS. 1 and 2 and the crystal oscillator 10b illustrated in FIGS. 3 and 4. Similarly, a crystal resonator 11 illustrated in FIG. 6 is substantially identical to the crystal resonator 11a illustrated in FIGS. 1 and 2 and the crystal resonator 11b illustrated in FIGS. 3 and 4. The crystal oscillator 10 includes the crystal resonator 11 and the peripheral circuitry 37, which includes a feedback resistor 51, a limiting resistor 52, inverter circuits 53 and 54, and capacitors 55 and 56.

The feedback resister 51 feeds back a signal from an output of the inverter circuit 53 to maintain the vibration of the crystal resonator 11. The limiting resistor 52 controls the current flowing into the crystal resonator 11, adjusts the negative resistance and the excitation level, reduces or prevents abnormal vibration of the resonator, and reduces or suppresses frequency fluctuation.

The inverter circuit 53 operates as an amplifier circuit. The inverter circuit 53 amplifies the signal output from the crystal resonator 11 and supplies the amplified signal to the inverter circuit 54. The inverter circuit 54 operates as a buffer circuit. The inverter circuit 54 operates to perform waveform shaping on the input frequency signal and/or to lower the output impedance. The capacitors 55 and 56 are set to specified load capacities to adjust the negative resistance, the excitation level, and the oscillation frequency.

Figure 7:
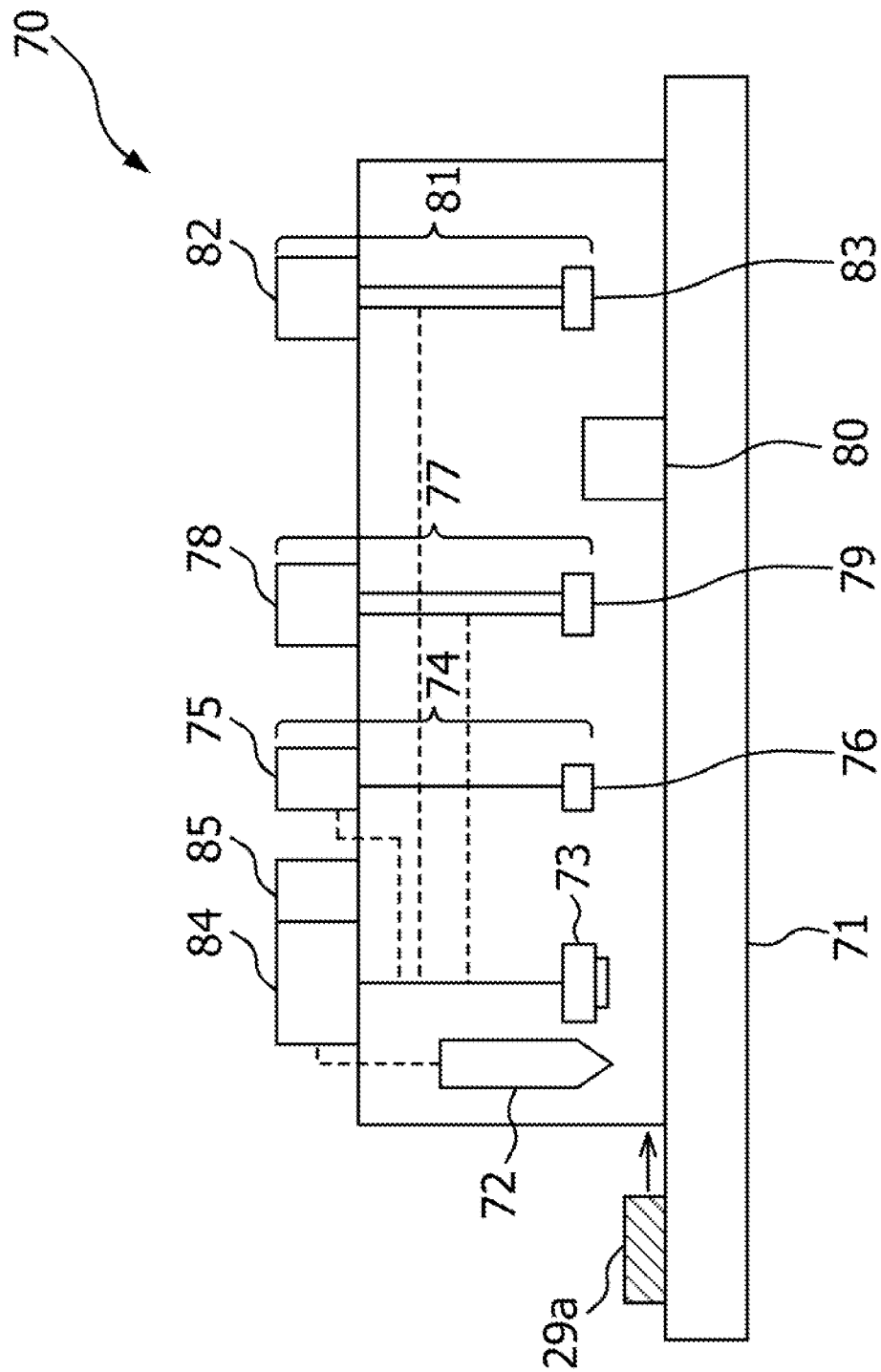
FIG. 7 illustrates an example crystal-oscillator fabricating apparatus.

FIG. 7 illustrates an example crystal-oscillator fabricating apparatus. A crystal-oscillator fabricating apparatus 70 includes a conveying unit 71, a constant liquid delivery unit 72, an optical unit 73, a laser emitting unit 74, a crystal-resonator positioning unit 77, a heating unit 80, a cover attachment unit 81, a control unit 84, and a storage unit 85.

For example, the package 29a is disposed above the conveying unit 71, and the conveying unit 71 moves the package 29a into the crystal-oscillator fabricating apparatus 70. The conveying unit 71 conveys the package 29a to the optical unit 73, the laser emitting unit 74, the crystal-resonator positioning unit 77, the heating unit 80, and the cover attachment unit 81.

The constant liquid delivery unit 72 discharges the conductive adhesive to the electrode pad indicated by a control instruction from the control unit 84 at a timing indicated by a control instruction from the control unit 84.

The optical unit 73 acquires an image of the electrode pads and the vicinity thereof from above the electrode pads in the package. The optical unit 73 includes an image sensor, for example, a charge coupled device (CCD) or a complementary metal oxide semiconductor (CMOS).

The laser emitting unit 74 includes a laser light source 75 and a laser-emitting optical system 76. The laser light source 75 emits a laser beam. The laser light source 75 is, for example, an yttrium aluminum garnet (YAG) laser light source. The laser light source 75 has, for example, a YAG rod and a flash lamp; and it generates a laser beam by flashing the YAG rod with the flash lamp to excite the YAG rod. The laser-emitting optical system 76 has a reflective mirror and a slit; and it generates a laser form in accordance with a control instruction from the control unit 84 and emits the laser beam at an irradiation position indicated by a control instruction from the control unit 84. The laser emitting unit 74 can remove the conductive adhesive by irradiating the conductive adhesive in accordance with a control instruction from the control unit 84.

The crystal-resonator positioning unit 77 includes a feeder section 78 and a head section 79. The feeder section 78 is filled with many crystal resonators, which are supplied to the head section 79 by the feeder section 78. The head section 79 disposes electrodes of a crystal resonator on the conductive adhesive discharged from the constant liquid delivery unit 72.

The heating unit 80 heats the conductive adhesive for curing after a crystal resonator is disposed on the conductive adhesive. The heating unit 80 heats the conductive adhesive to, for example, approximately 180° C. to allow curing such that the electrodes of the crystal resonator are secured to the electrode pads.

The cover attachment unit 81 includes a feeder section 82 and a head section 83. The feeder section 82 is filled with the cover 36, which is supplied to the head section 83 by the feeder section 82. The head section 83 attaches the cover 36 to the package. In this way, a crystal oscillator is fabricated.

The control unit 84 executes programs stored in the storage unit 85 to control the operation of the units included in the crystal-oscillator fabricating apparatus 70. The control unit 84 is, for example, a central processing unit (CPU). The control unit 84 includes a computation execution unit and a level 1 cache memory, which are not illustrated in FIG. 7. The level 1 cache memory is, for example, a static random access memory (SRAM). Data and commands frequently used by the computation execution unit are stored in the level 1 cache memory.

The control unit 84 controls the discharge timing of the conductive adhesive by the constant liquid delivery unit 72 and controls the constant liquid delivery unit 72, which controls the discharge amount. The control unit 84 may also control the timing of mounting a crystal resonator to the package by the crystal-resonator positioning unit 77 and the timing of mounting the cover 36 to the package by the cover attachment unit 81.

The control unit 84 performs image recognition processing for detecting the position and size of the conductive adhesive applied to an electrode pad from an image acquired by the optical unit 73. When at least part of the conductive adhesive applied to areas outside the electrode pad, the control unit 84 controls laser irradiation for removing at least part of the conductive adhesive applied to areas outside the electrode pad. The control unit 84 also controls laser irradiation such that a laser beam is emitted at the conductive adhesive to remove at least part of the conductive adhesive that is applied to areas outside a specified area having a specified size. The control unit 84 also controls the crystal-resonator positioning unit 77 to dispose a crystal resonator at a specified position in the package and instructs the heating unit 80 to carry out heating.

The storage unit 85 uses a semiconductor device to electrically store data and holds the programs executed by the control unit 84. The programs are coded to configure tasks, processes, and threads for realizing the above-described control processes. The storage unit 85 may be, for example, a main memory and/or a low-level cache memory disposed in a low level of the cache memory included in the control unit 84.

The low-level cache memory holds the content stored in the cache memory included in the control unit 84. The low-level cache memory may be, for example, an SRAM. The main memory may be, for example, a dynamic random access memory (DRAM). The flash memory may be, for example, an electrically erasable programmable read only memory (EEPROM). The storage unit 85 may have an external storage device in which the programs can be stored. The external storage device may be, for example, a disk array of magnetic disks, a solid state drive (SSD) using a flash memory, or an optical disk drive. The external storage device may be configured so that it supplies programs to external devices by loading a recording medium, such as a memory card or a digital versatile disc (DVD), into the external storage device.

Figure 8:
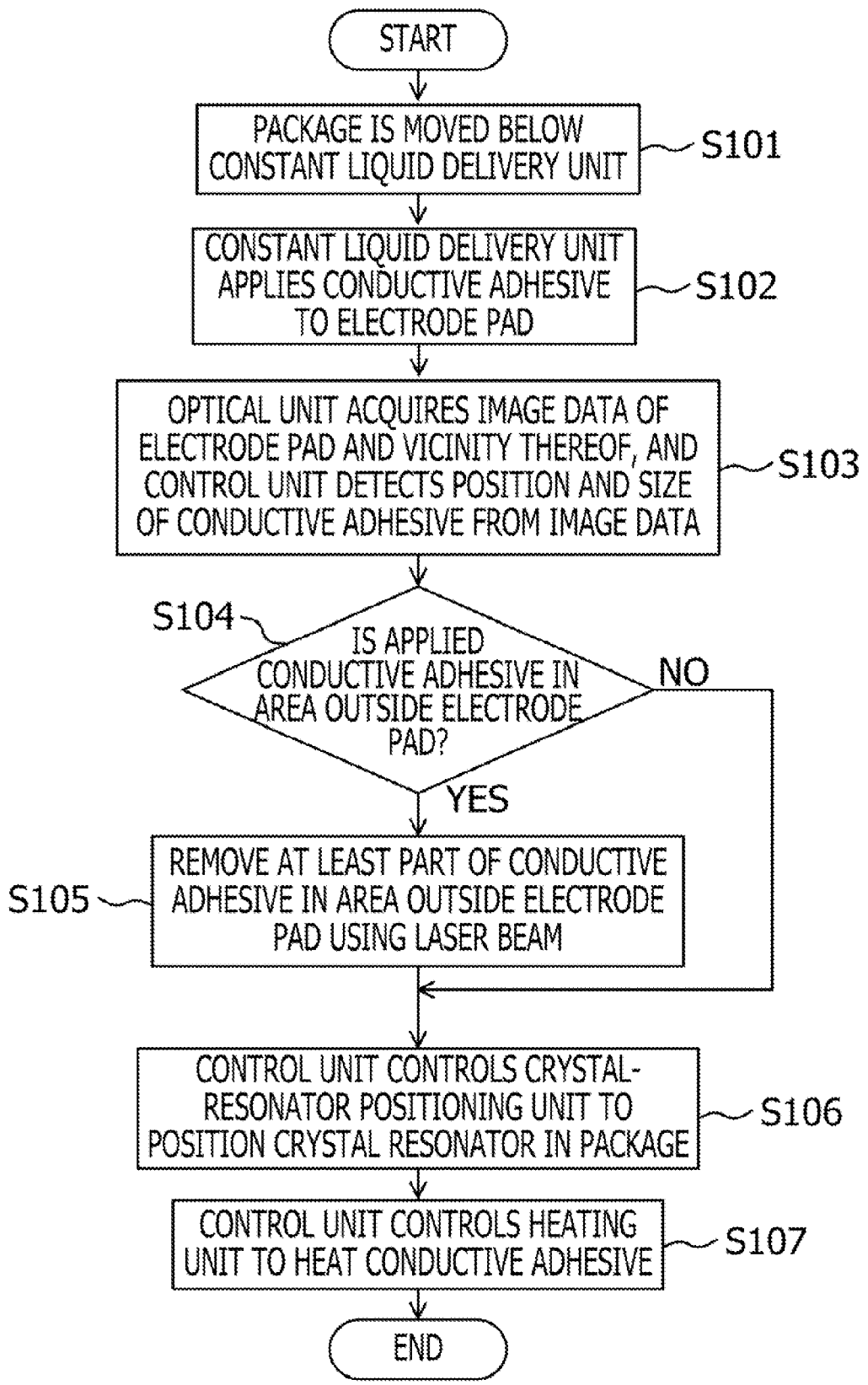
FIG. 8 illustrates an example flow chart for a method of fabricating a crystal oscillator.

FIG. 8 illustrates a flow chart of an example method of fabricating a crystal oscillator. The method of fabricating a crystal oscillator, which is illustrated in FIG. 8, will be described with reference to FIGS. 9A to 17B.

Figure 9A:
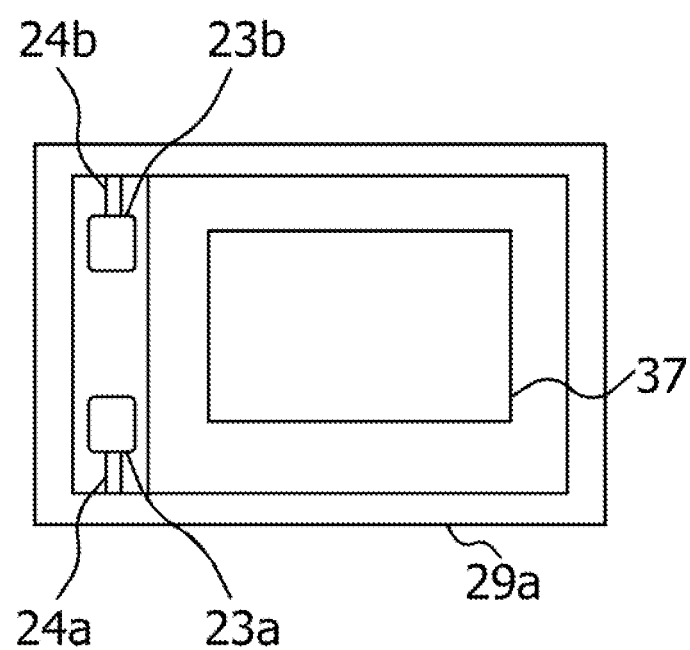
FIG. 9A illustrates a top view of a package having wiring patterns.
Figure 9B:
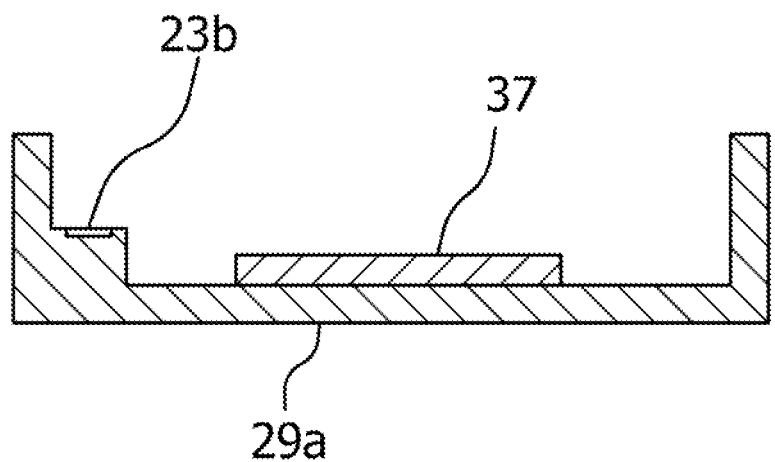
FIG. 9B illustrates a sectional view of the package having wiring patterns.

In the method of fabricating a crystal oscillator, first, the package 29a is conveyed to an area below the constant liquid delivery unit 72 (S101). FIG. 9A illustrates a top view of an example package having a wiring pattern. FIG. 9B illustrates a sectional view of an example package having a wiring pattern. The package 29a illustrated in FIGS. 9A and 9B includes the electrode pads 23a and 23b, wiring patterns 24a and 24b, and the peripheral circuitry 37. The wiring patterns 24a and 24b are connected to the electrode pads 23a and 23b, respectively, and the peripheral circuitry 37.

Figure 10B:
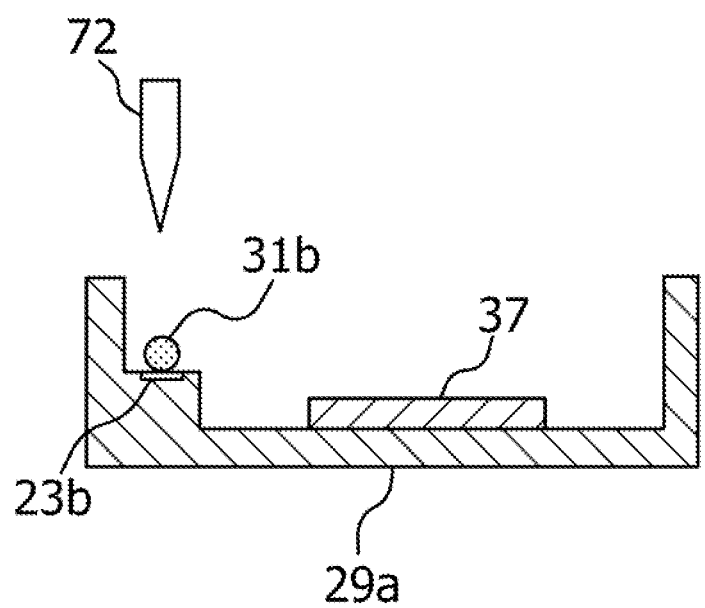
FIG. 10B illustrates a sectional view of a package in which a conductive adhesive is applied.

Next, the constant liquid delivery unit 72 applies the conductive adhesive to the electrode pads 23a and 23b (S102). FIG. 10A illustrates a top view of an example of a package to which the conductive adhesive is applied. FIG. 10B illustrates a sectional view of an example of a package to which the conductive adhesive is applied. As illustrated in FIGS. 10A and 10B, the constant liquid delivery unit 72 applies the conductive adhesive to the edges of the electrode pads 23a and 23b opposite to the wiring patterns 24a and 24b. In other words, in FIG. 10A, the constant liquid delivery unit 72 applies the conductive adhesive to an area on the package 29a more inward than the centers of the electrode pads 23a and 23b. The conductive adhesive is applied to areas away from the wiring patterns 24a and 24b to reduce or prevent damage to the wiring patterns 24a and 24b due to a laser beam emitted from the laser light source 75 for removing the conductive adhesive.

The optical unit 73 acquires image data of the electrode pads and the vicinity thereof from above the package 29a, and the control unit 84 detects, on the basis of the acquired image data, the position and the size of the conductive adhesive applied to an electrode pad (S103). FIGS. 11 to 14E illustrate examples of image data of the conductive adhesive applied to an electrode pad detected by the control unit 84.

The image data corresponding to FIGS. 11 to 14E includes the electrode pad 23b, the wiring pattern 24b, and the conductive adhesive 31b. The control unit 84 quantized the image data on the basis of a threshold of contrast ratio to distinguish between the image of the conductive adhesive and other images.

Figure 11:
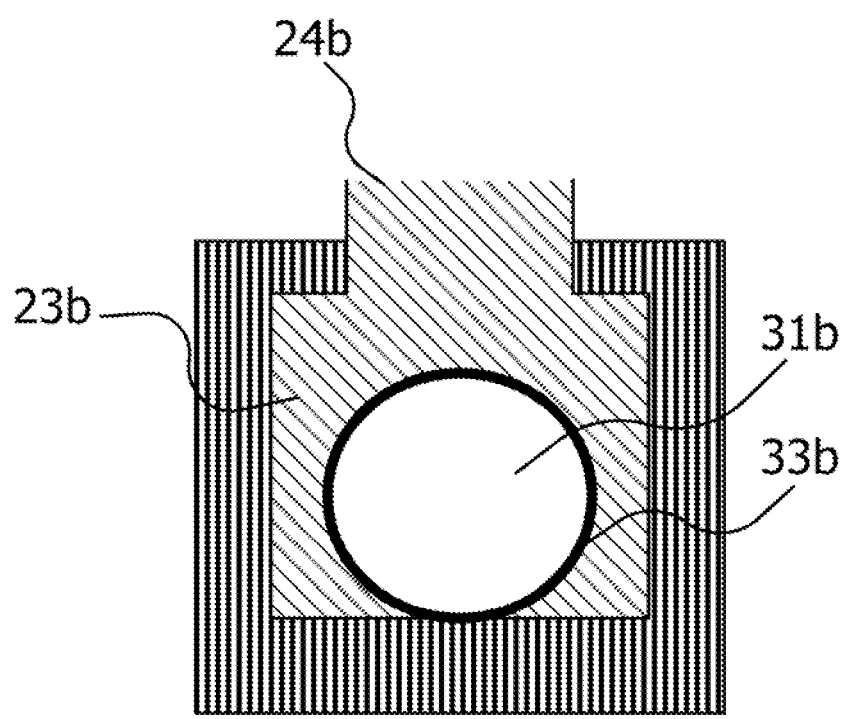
FIG. 11 illustrates an example image of a conductive adhesive applied to an electrode pad.

By distinguishing the images in this way, the control unit 84 detects the size and position of the conductive adhesive 31b, including that represented by an area 33b in FIG. 11. The detected area 33b is calculated as a circle having a minimum radius sufficient for the conductive adhesive 31b. The control unit 84 detects the position of the conductive adhesive 31b with respect to the electrode pad 23b on the basis of the positional coordinates of the detection size. In this way, the control unit 84 detects the position and the size of the conductive adhesive 31b.

The control unit 84 determines whether or not the conductive adhesive is applied to areas outside the electrode pad (S104). When the conductive adhesive is applied to an area outside the electrode pad (YES in S104), the control unit 84 operates the laser-emitting optical system 76 to remove at least part of the conductive adhesive applied to an area outside the electrode pad (S105). When the conductive adhesive is not applied to an area outside the electrode pad (NO in S104), the control unit 84 carries out the processing in Step S106.

Figure 12:
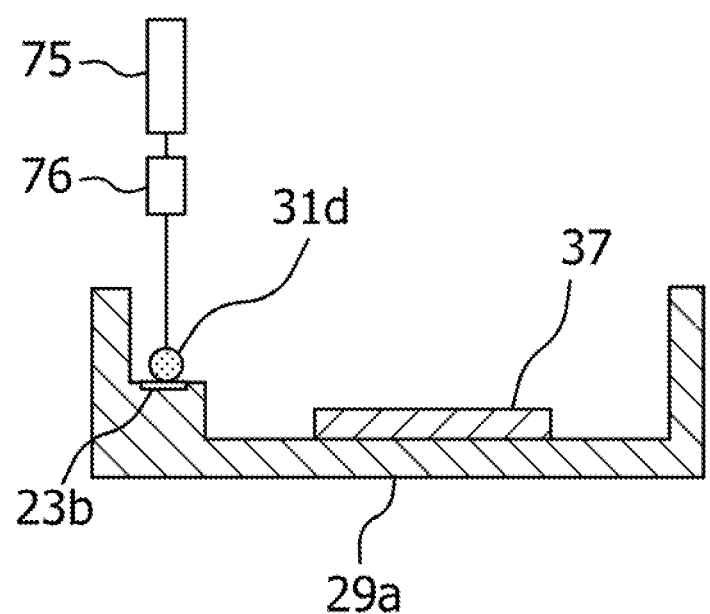
FIG. 12 illustrates an example of laser removal of part of an applied conductive adhesive.

FIG. 12 illustrates an example of laser removal of the applied conductive adhesive. As illustrated in FIG. 12, the control unit 84 operates the laser light source 75 and the laser-emitting optical system 76 to remove by a laser beam at least part of the conductive adhesive applied to an area outside the electrode pad.

Figure 13:
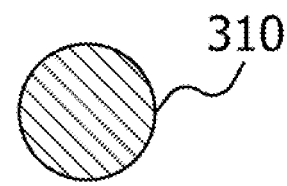
FIG. 13 illustrates examples laser beam shapes.
Figure 13:
Figure 13:
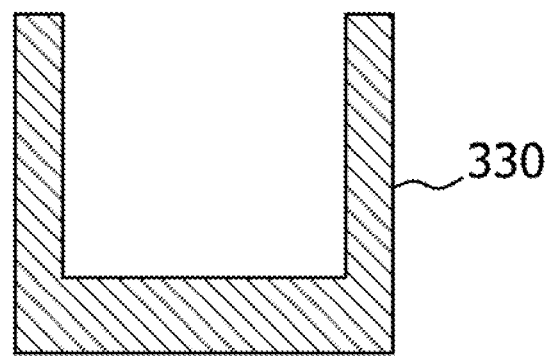
Figure 13:
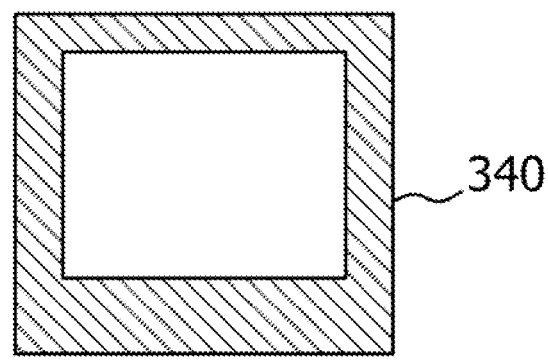

FIG. 13 illustrates examples of the shape of the laser beam to be emitted in Step S105. The beam shapes illustrated in FIG. 13 are formed by lenses included in the laser-emitting optical system 76. A beam shape 310 is a point beam shape. A beam shape 320 is a rectangular beam shape. A beam shape 330 is a squared U-shape and can be used to irradiate three sides of an electrode pad with a laser beam and may reduce or prevent incidences of the wiring pattern connected to the electrode pad being irradiated. A beam shape 340 surrounds an electrode pad and can be used to irradiate an electrode pad of an inner layer wiring, which is described below.

Figure 14A:
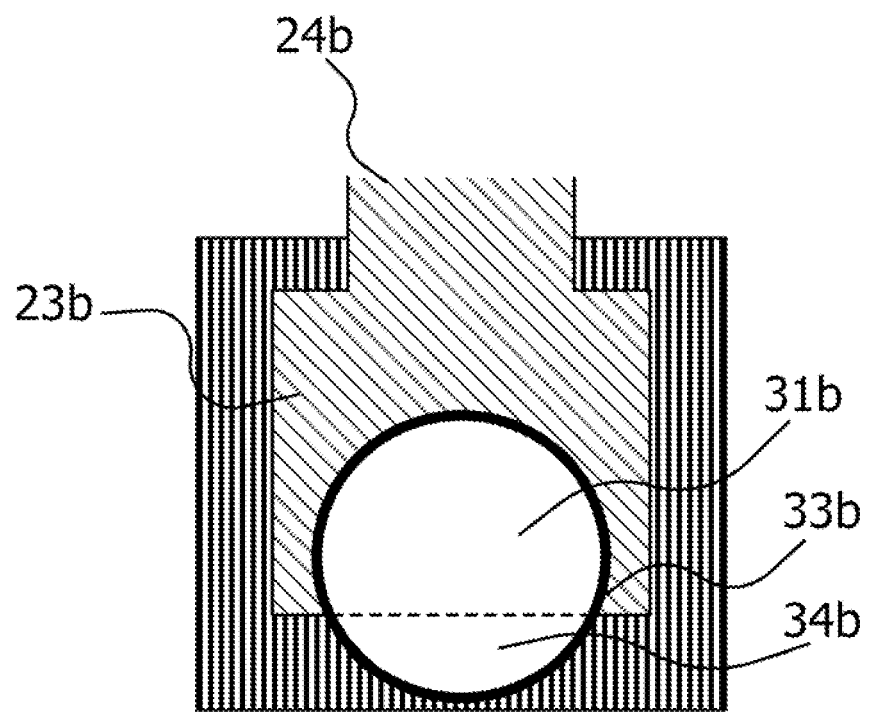
FIG. 14A illustrates an example image of a conductive adhesive applied to an electrode pad.

FIG. 14A illustrates an example image of part of the conductive adhesive being applied to an area outside the electrode pad. The control unit 84 detects the position of the conductive adhesive 31c, such as that represented by an area 33b in FIG. 14A, and determines that a section 34b of the conductive adhesive 31c is applied to an area outside the electrode pad 23b.

Figure 14B:
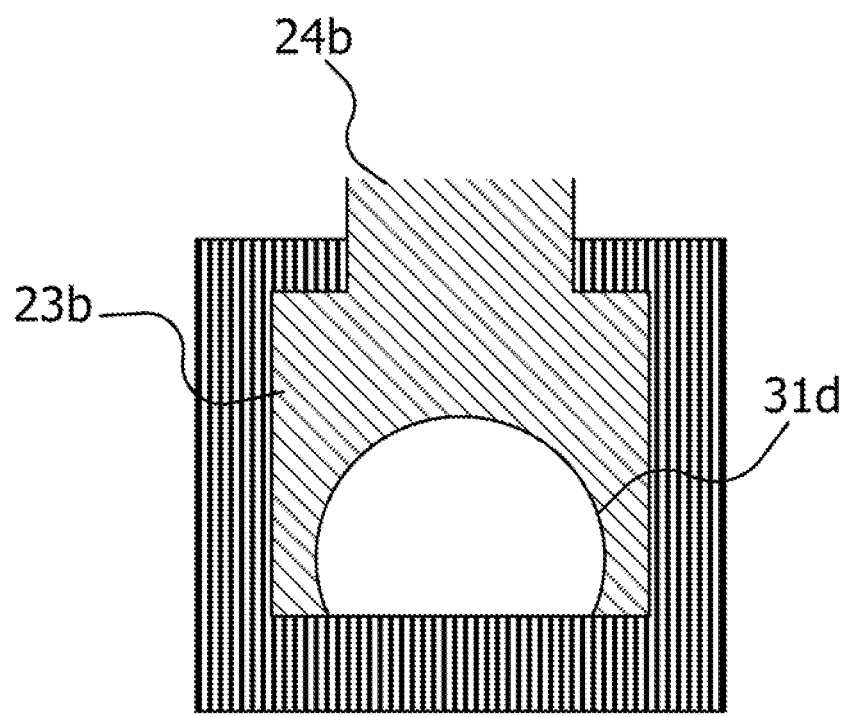
FIG. 14B illustrates an example image of a conductive adhesive applied to an electrode pad.

FIG. 14B illustrates an example image of part of the conductive adhesive being removed by a laser beam. In FIG. 14B, the section 34b illustrated in FIG. 14A is removed by a laser beam, and the conductive adhesive 31d after removal of part of the conductive adhesive by a laser beam is positioned inside the electrode pad 23b. The control unit 84 operates the laser light source 75 and the laser-emitting optical system 76 to remove the section opposite to the wiring pattern 24b without cutting the wiring pattern 24b. In laser removal, for example, the beam shape 320 or the beam shape 330 may be used.

In FIG. 14B, a case in which the conductive adhesive runs off to the side opposite to the wiring pattern 24b is illustrated. Laser removal is also possible when the conductive adhesive runs off to the left or right. As illustrated in FIG. 10A, conductive adhesives are disposed on the electrode pads 23a and 23b on the sides opposite to the wiring patterns. Therefore, even when the conductive adhesive is applied to an area closer to the wiring pattern, the conductive adhesive may be disposed on the electrode pads 23a and 23b unless the conductive adhesive is applied very close to the wiring pattern.

Figure 14C:
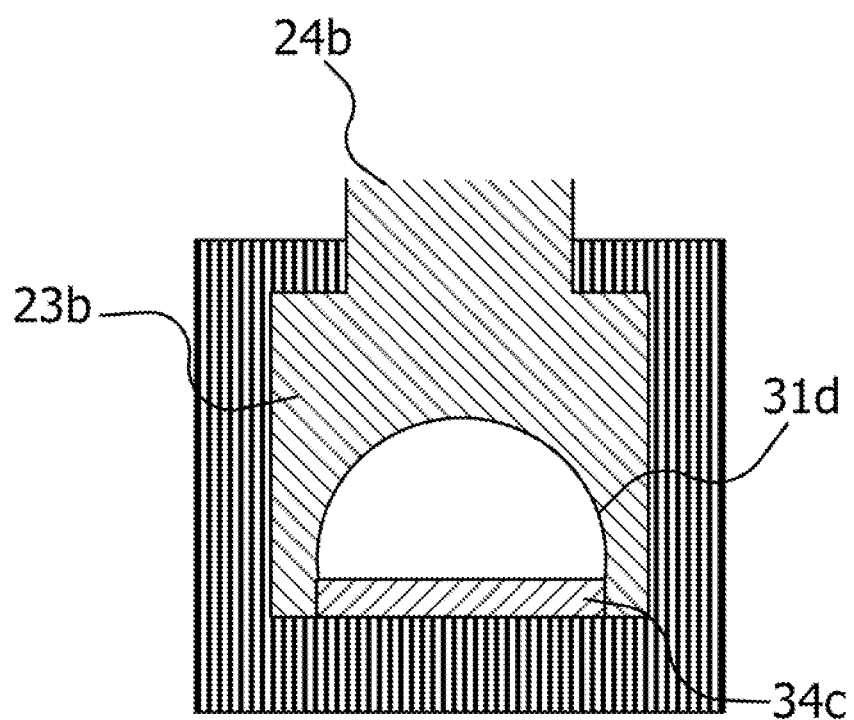
FIG. 14C illustrates an example image of a conductive adhesive applied to an electrode pad.

FIG. 14C illustrates another example image of part of the conductive adhesive being removed by a laser beam. In FIG. 14C, a section 34c is irradiated with a laser beam. The shape of the laser beam emitted in this case is, for example, the beam shape 320 or the beam shape 330 illustrated in FIG. 13. The section 34c is on the electrode pad 23b. Even if this section is irradiated with a laser beam, the wiring pattern 24b is not damaged. Therefore, the electrode pad may be irradiated with a laser beam. By irradiating the section 34c on the electrode pad 23b with a laser beam and removing the conductive adhesive in the section 34c, even if of the conductive adhesive 31d runs off, it can remain in the section 34c. That is, when an area outside the electrode pad is irradiated with a laser beam, as illustrated in FIG. 14B, the conductive adhesive can still run off the electrode pad after laser irradiation. Thus, by removing part of the conductive adhesive 31d on the electrode pad, as illustrated in FIG. 14C, the conductive adhesive remains in the area where the conductive adhesive has been removed, and, as a result, the conductive adhesive is less likely to run off to areas outside the electrode pad.

As illustrated in FIGS. 14B and 14C, by removing part of the conductive adhesive, the position and the size of the conductive adhesive applied to the electrode pad can be maintained. In this way, by maintaining the position and the size of the conductive adhesive applied to the electrode pad, the force of the conductive adhesive supporting the crystal resonator can be maintained substantially constant, and the precision of the natural frequency of the crystal resonator can be increased. Furthermore, by reducing or preventing incidences of the conductive adhesive running off to areas outside the electrode pad, short-circuiting of the other electrode pad can be reduced or prevented.

Figure 14D:
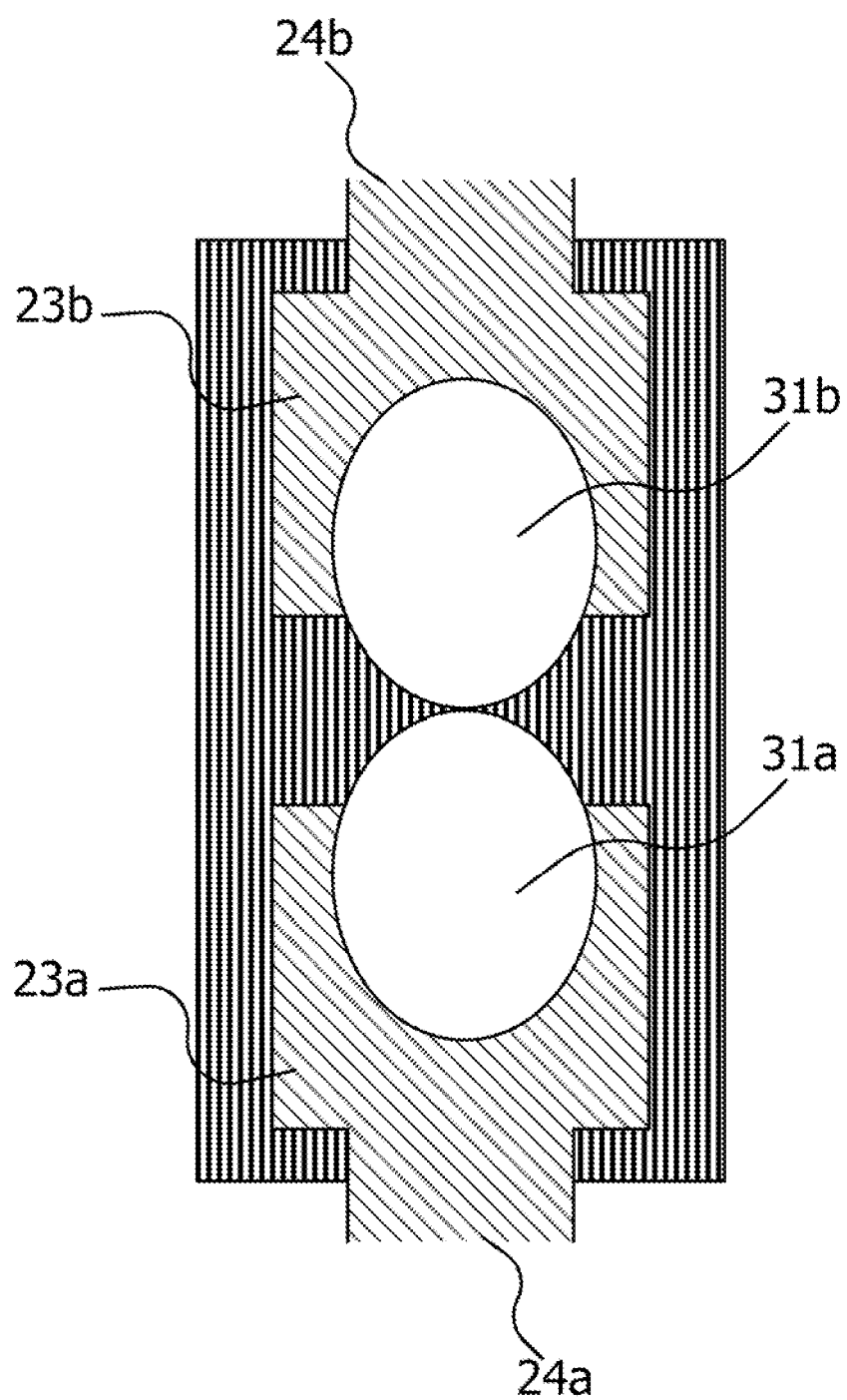
FIG. 14D illustrates an example image of a conductive adhesive applied to an electrode pad.

FIG. 14D illustrates an example image of conductive adhesives that have run off to areas outside the electrode pads and have come into contact with each other. This does not occur in a double-cantilever crystal oscillator, which is illustrated in FIGS. 3 and 4, but might occur in a cantilever crystal oscillator, which is illustrated in FIGS. 1 and 2, when the conductive adhesive runs off inward and contacts a conductive adhesive that has run off from another electrode pad. As illustrated in FIG. 14D, when conductive adhesives 31a and 31b of different electrode pads contact each other, the crystal resonator will not operate because a voltage cannot be applied to the crystal element. In such a case, since the conductive adhesives are applied to areas outside the electrode pads (YES in S104), the control unit 84 operates the laser-emitting optical system 76 and removes part of the conductive adhesives in areas outside the electrode pads (S105).

Figure 14E:
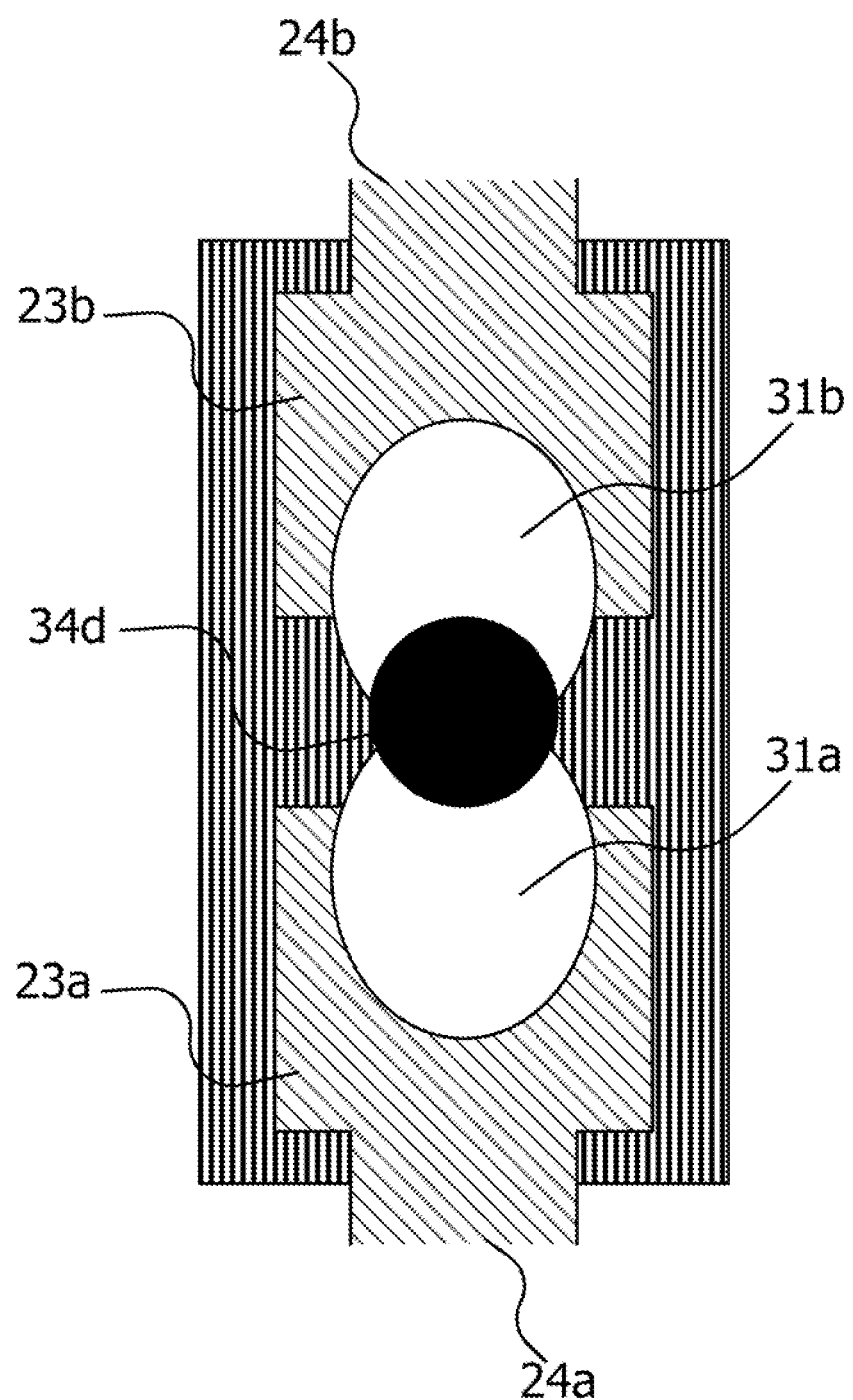
FIG. 14E illustrates an example image of a conductive adhesive applied to an electrode pad.

FIG. 14E illustrates an example of electrode pads and the vicinity thereof where part of the conductive adhesives illustrated in FIG. 14D is removed by a laser beam. A section 34d is an area in the middle of and on the inner sides of the electrode pads 23a and 23b. In FIG. 14E, the run-off conductive adhesives 31a and 31b in the section 34d are removed by a laser beam by operating the laser light source 75 and the laser-emitting optical system 76 by the control unit 84. At this time, the beam shape of the irradiation laser beam is, for example, the beam shape 310 illustrated in FIG. 13. In this way, by removing the conductive adhesives in the section 34d to reduce or prevent incidences of the conductive adhesives from contacting each other, normal operation of the crystal resonator is maintained.

Next, the control unit 84 operates the conveying unit 71 to move the package 29a below the crystal-resonator positioning unit 77, where the crystal resonator is mounted on the package 29a (S106).

Figure 15:
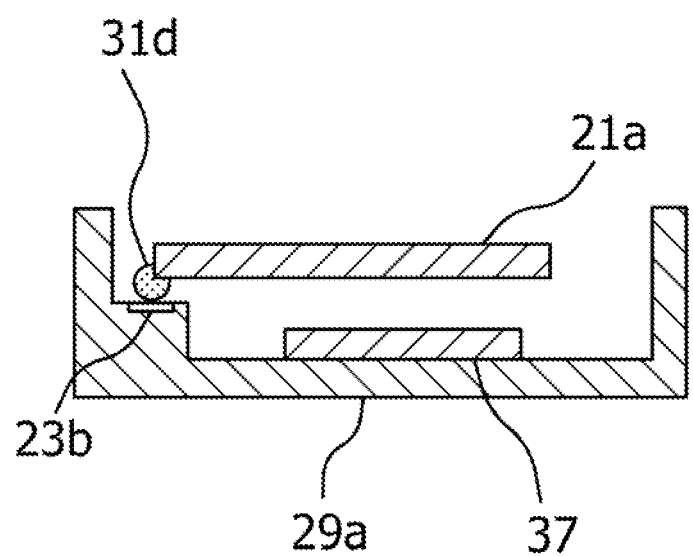
FIG. 15 illustrates an example crystal resonator disposed on a conductive adhesive.

FIG. 15 illustrates an example arrangement of the crystal resonator and the conductive adhesive. As illustrated in FIG. 15, the crystal resonator 11a is disposed in the package 29a so that the crystal resonator 11a is supported by the conductive adhesive.

The control unit 84 operates the heating unit 80 to heat the conductive adhesive (S107). In this way, the crystal oscillator is fabricated.

In the above-described method of fabricating a crystal oscillator, the crystal oscillator is fabricated using a package having wiring patterns. Instead, however, the crystal oscillator may be fabricated using a package having inner-layer wiring.

Figure 16A:
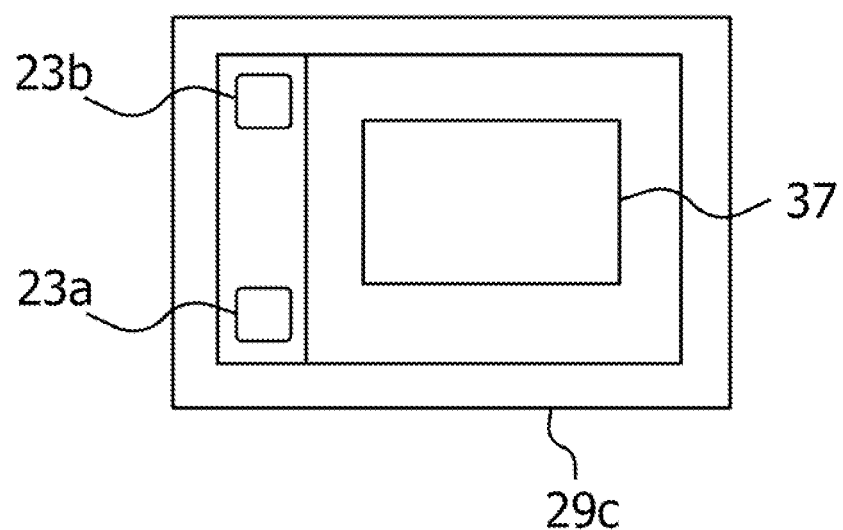
FIG. 16A illustrates a top view of a package having inner-layer wires.
Figure 16B:
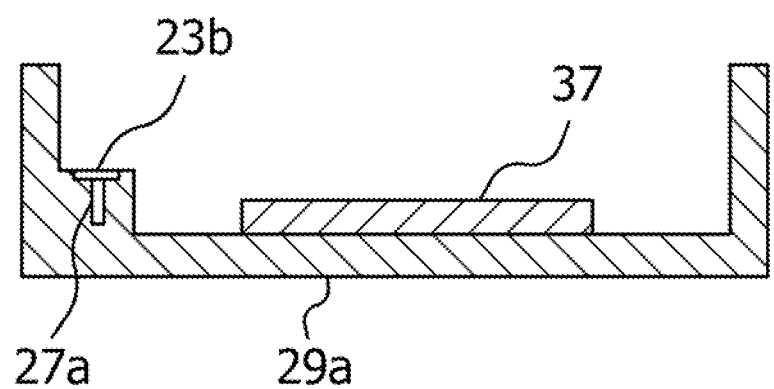
FIG. 16B illustrates a sectional view of the package having inner-layer wires.

FIG. 16A illustrates a top view of an example package having inner-layer wires. FIG. 16B illustrates a sectional view of an example package having inner-layer wires. A package 29c illustrated in FIGS. 16A and 16B has the peripheral circuitry 37 and inner-layer wires 27a and 27b penetrating part of the package 29c. The inner-layer wires 27a and 27b are connected to the electrode pads 23a and 23b, respectively, and the peripheral circuitry 37.

As illustrated in FIG. 16A, since the package 29c does not include the wiring patterns 24a and 24b illustrated in FIG. 10A, damage to wiring patterns does not have to be considered when removing a conductive adhesive that has run off an electrode pad. Therefore, in the above-described Step S102, the constant liquid delivery unit 72 does not apply a conductive adhesive toward the side of an electrode pad but applies it at the center of the electrode pad.

Figure 17A:
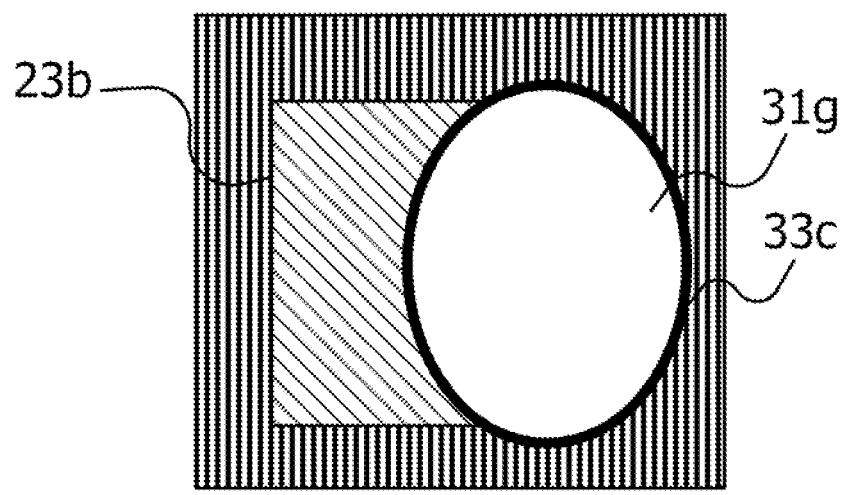
FIG. 17A illustrates an example image of a conductive adhesive.
Figure 17B:
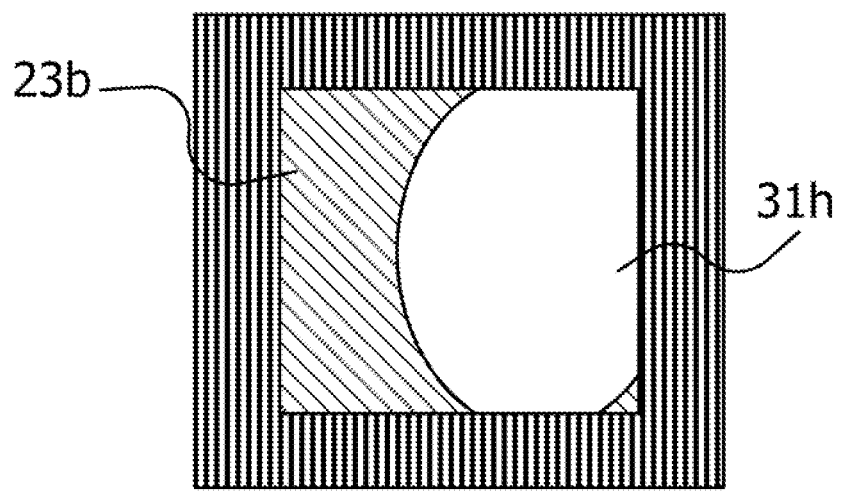
FIG. 17B illustrates an example image of a conductive adhesive.

FIGS. 17A and 17B illustrate example images of the conductive adhesive detected by the control unit 84. In the above-described Step S103, image data corresponding to FIGS. 17A and 17B is acquired. The image data corresponding to FIGS. 17A and 17B includes the electrode pad 23a and a conductive adhesive 31g. The control unit 84 quantized the image data on the basis of a threshold of contrast ratio to distinguish between the image of the conductive adhesive and other images.

By distinguishing the images in this way, the control unit 84 detects the size and position of the conductive adhesive 31g, including that represented by an area 33c in FIG. 11. The detected area 33c is calculated as a circle having a minimum radius sufficient for the conductive adhesive 31g. In this way, the control unit 84 detects the position of the conductive adhesive 31g with respect to the electrode pad 23a on the basis of the position of the detected area 33c.

As illustrated in FIG. 17A, with a package having inner-layer wires, a conductive adhesive is applied at the center of an electrode pad, and not toward the sides of the electrode pad; therefore, the conductive adhesive may run off the electrode pad in any direction.

FIG. 17B illustrates the conductive adhesive after the parts that have run off are removed by a laser beam in Step S105. As illustrated in FIG. 17B, part of the conductive adhesive 31g is removed by being irradiated with a laser beam, and the shape of the conductive adhesive may become as that indicated by reference numeral 31h. At this time, the shape of the laser beam is, for example, the beam shape 340 illustrated in FIG. 13. As illustrated in FIG. 17B, since the package having inner-layer wires does not have wiring patterns, the conductive adhesive can be removed from the periphery of the electrode pad without considering damage to the wiring pattern. Thus, with the package having inner-layer wires, a problem of wiring patterns being damaged by laser beam irradiation does not occur.

As described above, according to the method of fabricating a crystal oscillator, incidences of conductive adhesives (that are applied to different electrode pads) contacting each other can be reduced or prevented, and the conductive adhesive applied to an electrode pad can be formed into a desired shape by being irradiated with a laser beam. Therefore, the method of fabricating a crystal oscillator is capable of fabricating high quality crystal oscillators without variation in their characteristics by providing conductive adhesives with uniform shapes and is capable of increasing the yield by fabricating many crystal oscillators that satisfy a specified quality standard.

Figure 18:
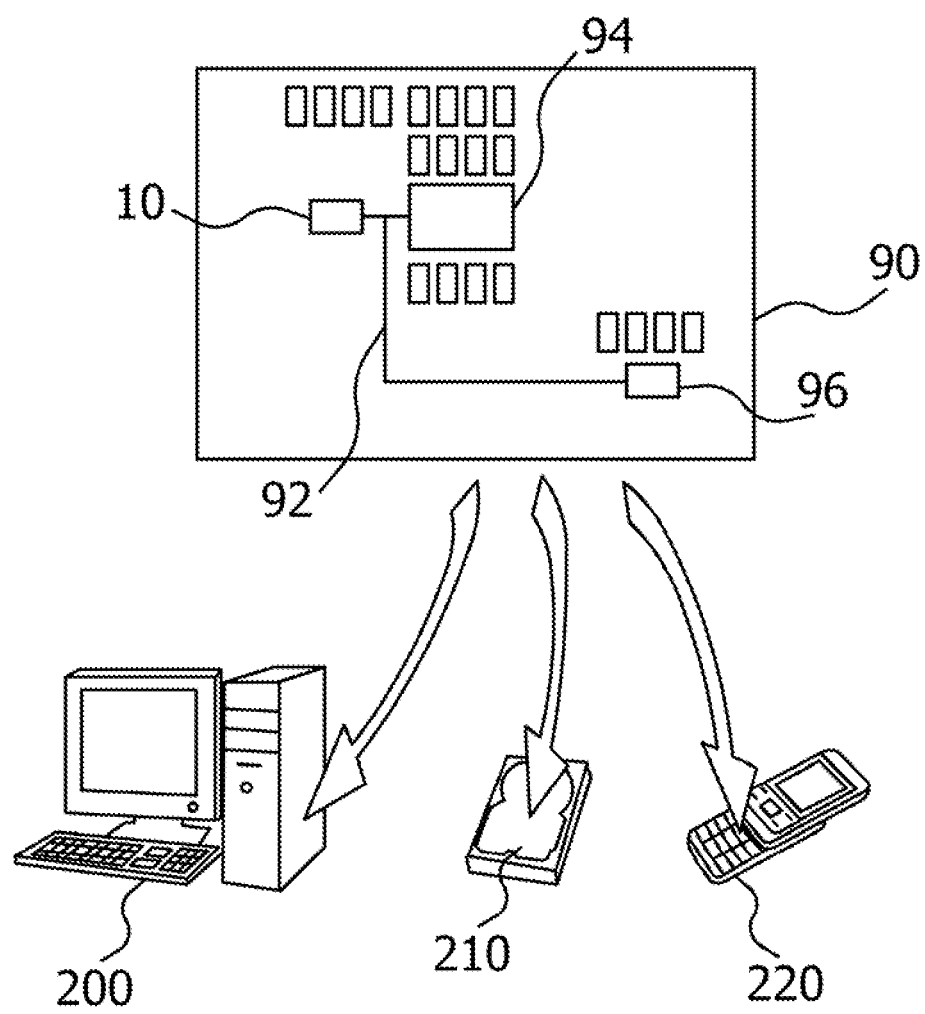
FIG. 18 illustrates an example crystal oscillator disposed on a printed circuit board.

FIG. 18 illustrates an example crystal oscillator disposed on a printed circuit board. The crystal oscillator 10 provides a fixed frequency to integrated circuits 94 and 96 disposed on a printed circuit board 90 via wire 92. The printed circuit board 90 having this configuration may be used for a computer 200, a hard disk device 210, and a mobile phone 220, for example.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present invention has been described in detail, it should be understood that the various changes, substitutions, and alterations could be made hereto without departing from the spirit and scope of the invention.

What is claimed is:

1. A method of fabricating a crystal oscillator comprising:
applying an adhesive to an electrode pad connected to a wiring pattern, the applying applies the adhesive on a side of the electrode pad opposite the wiring pattern;
acquiring image data of the electrode and a vicinity of the electrode by a optical unit;
detecting a size and a position of the adhesive by using the image data;
determining a position of a circle including the adhesive, the circle having a minimum radius sufficient for the adhesive;
determining whether the adhesive is in an area outside of the electrode pad by using a position of the circle;
removing at least part of the adhesive in the area outside of the electrode pad using a laser beam when a portion of the adhesive is determined to be in the area outside of the electrode pad; and
disposing an electrode of a crystal resonator on the adhesive applied to the electrode pad.

2. The method of fabricating a crystal oscillator according to claim 1, wherein the removing removes the at least part of the adhesive on the outside of the electrode pad at a side opposite to a leading direction of a wiring pattern using the laser beam.

3. The method of fabricating a crystal oscillator according to claim 1, further comprising irradiating a periphery of the electrode pad connected to an inner-layer wire with the laser beam.

4. A non-transitory computer readable medium storing a program, the program causing a processor to execute a method to control a crystal-oscillator fabricating apparatus comprising:
applying an adhesive to an electrode pad connected to a wiring pattern, the applying applies the adhesive on a side of the electrode pad opposite the wiring pattern;
acquiring image data of the electrode and a vicinity of the electrode by a optical unit;
detecting a size and a position of the adhesive by using the image data;
determining a position of a circle including the adhesive, the circle having a minimum radius sufficient for the adhesive;
determining whether the adhesive is in an area outside of the electrode pad by using a position of the circle;
removing at least part of the adhesive in the area outside of the electrode pad using a laser beam when a portion of the adhesive is determined to be in the area outside of the electrode pad; and
disposing an electrode of a crystal resonator on the adhesive applied to the electrode pad.

5. The non-transitory computer readable medium storing a program according to claim 4, wherein the removing removes the at least part of the adhesive on the outside of the electrode pad at a side opposite to a leading direction of a wiring pattern using the laser beam.

6. The non-transitory computer readable medium storing a program according to claim 4, further comprising irradiating a periphery of the electrode pad connected to an inner-layer wire with the laser beam.

\* \* \* \* \*